United States Patent [19]
Gilbert

[11] 3,708,691
[45] Jan. 2, 1973

[54] LARGE SCALE INTEGRATED CIRCUIT OF REDUCED AREA INCLUDING COUNTER

[75] Inventor: Barrie Gilbert, Portland, Oreg.

[73] Assignee: Tektronix, Inc., Beaverton, Oreg.

[22] Filed: Jan. 21, 1972

[21] Appl. No.: 219,727

Related U.S. Application Data

[62] Division of Ser. No. 845,286, July 28, 1969.

[52] U.S. Cl..........307/225 B, 307/223 B, 307/224 B, 307/226 B, 307/229, 307/303

[51] Int. Cl...........................................H03k 23/08

[58] Field of Search...307/220, 223 R, 223 B, 224 R, 307/224 B, 225 R, 225 B, 226 R, 226 B, 229, 303

[56] References Cited

UNITED STATES PATENTS 3,260,858 7/1966 Kueber ..............................307/225 B
3,368,083 2/1968 Dowding et al. ...................307/224 B
3,370,178 2/1968 Riseberg ..........................307/224 B

*Primary Examiner*—John S. Heyman
*Attorney*—Stephen W. Blore et al.

[57] ABSTRACT

An integrated circuit including four digital decade ring counters, four buffer storage circuits and four digital to analog converters is described in which each counter and associated storage circuit is provided within one epitaxial region surrounded by a single isolation region to greatly reduce the required semiconductor area. The counter includes a plurality of NPN transistors having common collectors provided by portions of the epitaxial region and a plurality of PNP transistors having common bases provided by other portions of such epitaxial region. Interconnections between NPN and PNP transistors are made through the epitaxial region including collector to base interconnections under which a plurality of buried layer regions are selectively diffused to lower their resistances. In addition, the PNP counter transistors are each provided with three separate collectors to simplify the counter.

8 Claims, 6 Drawing Figures

LARGE SCALE INTEGRATED CIRCUIT OF REDUCED AREA INCLUDING COUNTER

This is a division, of application Serial No. 845,286 filed July 28, 1969

BACKGROUND OF THE INVENTION

The subject matter of the present invention relates generally to monolithic integrated circuits of semiconductor material, and in particular to integrated circuits of bipolar transistors in which an entire circuit, such as a digital decade ring counter, is contained within one epitaxial region surrounded by a single isolation region. The isolation regions ordinarily used to separate the bipolar transistors within the counter circuit are eliminated and instead the epitaxial region is used as a common collector for the NPN transistors and as a common base for the PNP transistors. Also these transistors are connected together through the epitaxial region with a plurality of buried layer regions beneath the collector to base interconnections between transistors. As a result, the present integrated circuit is greatly reduced in semiconductor area over that of conventional integrated circuits. Thus, the present invention is especially useful for large scale integrated circuits.

Previous approaches to large scale integration include the "discretionary wiring" approach in which the transistors within the semiconductor wafer are selectively connected together by metal coatings whose positions are custom designed by a computer to bypass those transistors which are defective for any reason, such as due to crystal imperfections in the semiconductor material. The probability of such crystal imperfections occurring at the position of a circuit component increases greatly with conventional large scale integration because of the increased semiconductor area required. Another approach to this problem is the "redundant component" approach in which there is a duplication of circuit components thereby increasing the production yield but greatly increasing the semiconductor area of the already large integrated circuit. The present invention avoids the need for costly computer metalization and space consuming redundancy by reducing the area of the integrated circuit by a factor of 20 times or more due to the elimination of isolation regions and metal interconnections between transistors as mentioned previously. Due to the smaller size of the present integrated circuit, the probability of a circuit component occurring at the site of a crystal lattice imperfection is greatly reduced thereby enabling a high production yield.

In addition, the counter circuit of the present invention is less complex than conventional counter circuits because many transistors are eliminated by employing multiple collector PNP transistors in which three separate collectors are employed for each transistor, to perform different functions. The NPN and PNP transistors are interconnected by collector to base connections through the epitaxial region and these interconnections are provided with low resistance by buried layer regions of about 20 ohms per square sheet resistance selectively diffused beneath the epitaxial layer under such interconnections. As a result, the epitaxial layer may have a high sheet resistance on the order of about 2,000 to 5,000 ohms per square to effectively isolate the collectors of the NPN transistors from each other and isolate the bases of the PNP transistors from each other even though they are provided by the same epitaxial region.

In addition to its small area, the elimination of the metal interconnections between transistors within the counter and buffer storage circuits also greatly increases the production yield and reliability of the present integrated circuit.

One digital decade ring counter provided in an integrated circuit, made in accordance with the present invention and including 40 transistors and 20 resistors contained within the same epitaxial region, has been formed in a region of 0.006 inch by 0.025 inch with an area of only 0.000150 square inch which is less than one-twentieth of that of comparable counters in conventional integrated circuits. In another example, a large scale integrated circuit, including four such decade counters together with four buffer storage circuits and four digital to analog converters containing 324 transistors and 216 resistors, was formed in accordance with the present invention on a single semiconductor wafer 0.060 inch by 0.060 inch.

It is therefore one object of the present invention to provide an improved integrated circuit of smaller area and containing fewer components which is less expensive to manufacture and results in a higher production yield.

Another object of the invention is to provide an improved integrated circuit in which an entire electrical circuit including a plurality of bipolar transistors is provided within the same epitaxial region surrounded by a single isolation region thereby making the integrated circuit smaller in area due to the elimination of isolation regions between such transistors.

A further object of the present invention is to provide an improved integrated circuit of reduced size and complexity in which the same epitaxial region serves as a common collector region for several NPN transistors as well as a common base region for a plurality of PNP transistors which enables such transistors to be interconnected through the epitaxial region.

Still another object of the invention is to provide the above-mentioned integrated circuit with a plurality of buried layer regions within the same epitaxial region beneath at least some of the collector to base interconnections to provide such interconnections with a low resistance to minimize the metal leads used on the integrated circuit.

A still further object of the present invention is to provide an integrated circuit counter in which some of the PNP transistors are provided with three separate collector regions for performing different functions to simplify the counter circuit by enabling the elimination of several transistors.

An additional object of the present invention is to provide such a digital ring counter with buffer storage stages connected to the outputs of the counter stages and contained within the same epitaxial region as such counter so that they are surrounded by a single isolation region.

Other objects and advantages of the present invention will be apparent from the following detailed description of a preferred embodiment thereof and from the attached drawings of which:

DESCRIPTION OF PREFERRED EMBODIMENT

Figures 1, 2:
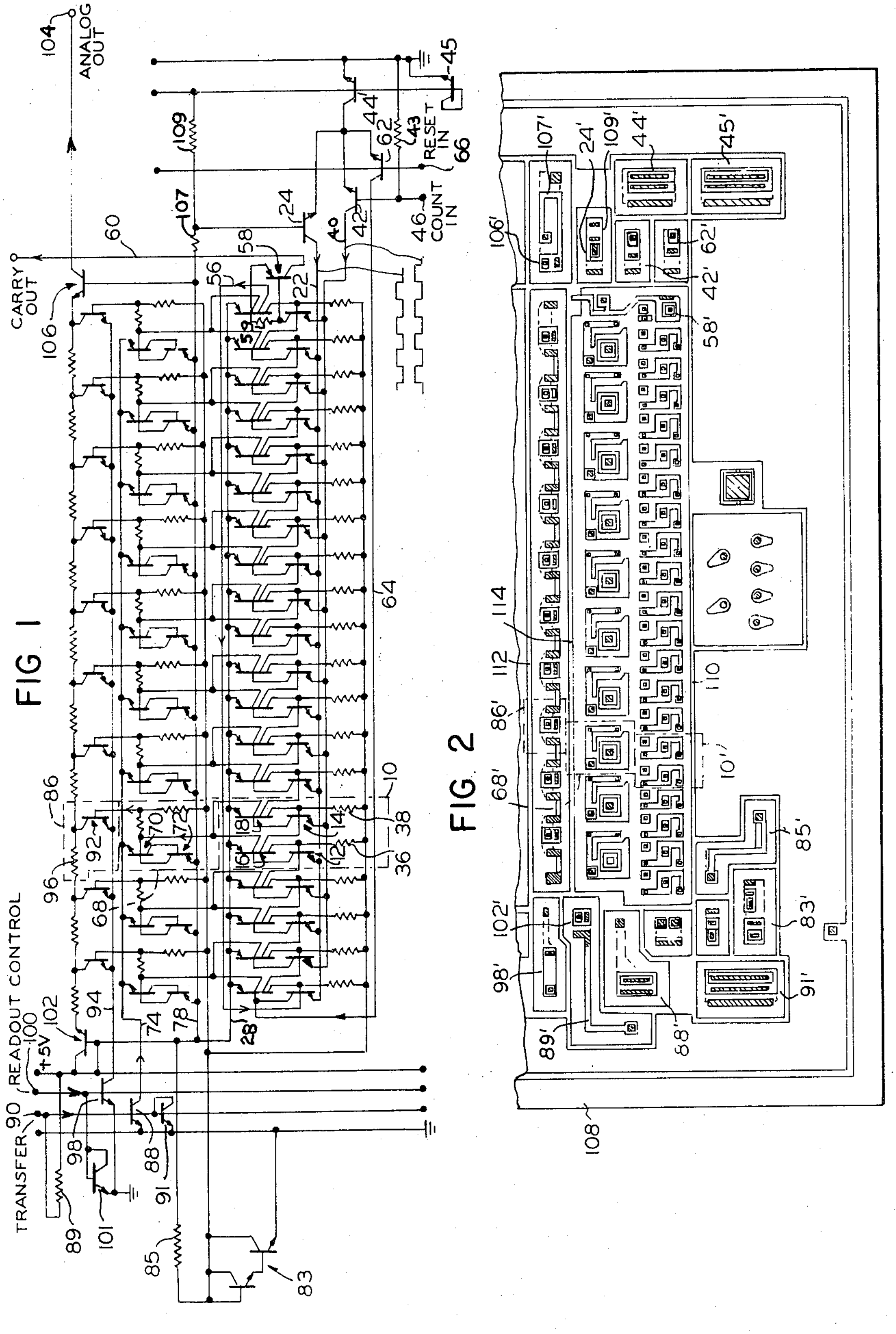
FIG. 1 is a schematic diagram of the electrical circuit of a digital decade ring counter and associated buffer storage circuit and analog to digital converter forming part of an integrated circuit made in accordance with the present invention.
FIG. 2 is an elevation view of a portion of an integrated circuit semiconductor member containing the counter circuit of FIG. 1.
Figures 1A, 4, 5:
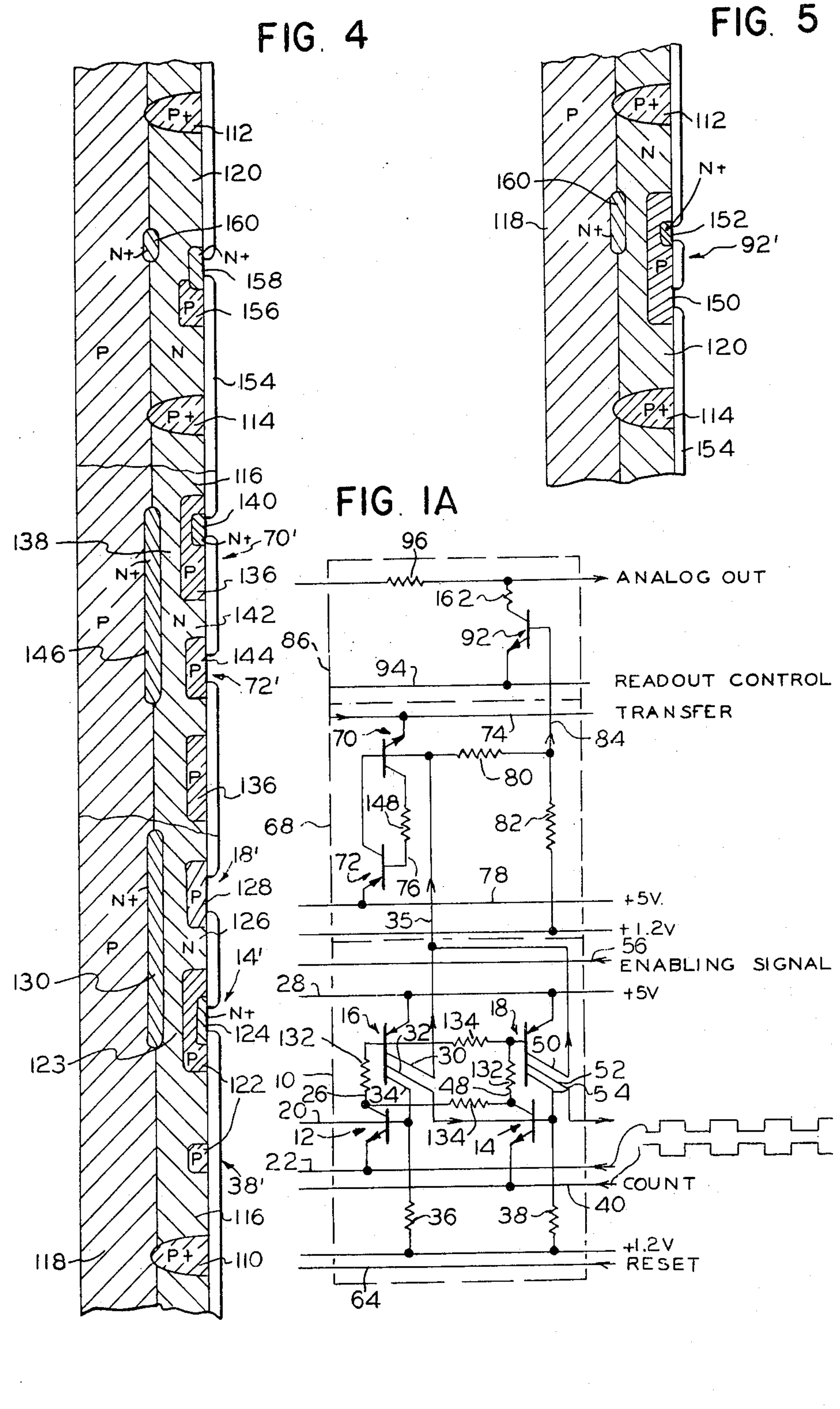
FIG. 1A is an enlarged view of a portion of the circuit of FIG. 1 including one counter stage.
FIG. 4 is a vertical section view taken along the line 4—4 of FIG. 3.
FIG. 5 is a vertical section view taken along the line 5—5 of FIG. 3.

As shown in FIG. 1, the integrated circuit of the present invention includes a digital ring counter having 10 identical counter stages 10 which are connected in succession to form a ring. One of the counter stages 10 is contained within a dashed-line box. This counter stage 10 is shown in FIG. 1A and includes a pair of NPN transistors 12 and 14 and a pair of PNP transistors 16 and 18. Transistor 12 has its base connected as an enabling input 20 to the output of the previous counter stage and has its emitter connected through a first count input conductor 22 to a first source of count pulses at the collector of an NPN switching transistor 24 in FIG. 1. The collector of the first NPN transistor 12 is connected through interconnection 26 to the base of the first PNP transistor 16 to provide a first bistable latching circuit forming one half of the counter stage. Transistor 16 has its emitter connected to a source of positive D.C. supply voltage of +5 volts at conductor 28 and is provided with three collectors 30, 32 and 34. The first collector 30 of transistor 16 is connected to an output 35 of the counter stage while its second collector 32 is connected to the other half stage of the counter stage at the base of the second NPN transistor 14 and its third collector 34 is connected to the base of transistor 12 to provide positive feedback. The bases of both transistors 12 and 14 are connected to a source of positive D.C. bias voltage of +1.2 volts through bias resistors 36 and 38 of 1 kilohm resistance. The other half of the counter stage 10 is provided by a second bistable latching circuit formed by transistors 14 and 18. Transistor 14 is connected at its emitter through a second count input conductor 40 to a second source of count pulses at the collector of an NPN switching transistor 42 whose base is connected to ground through a bias resistor 43 of 1.5 kilohms, as shown in FIG. 1.

The D.C. supply current for both count signal transistors 24 and 42 is provided by a current supply transistor 44 of NPN type having its collector connected in common to the emitters of transistors 24. The emitter of transistor 44 is grounded while its base is connected to a source of substantially constant D.C. supply voltage provided by a diode-connected transistor 45 having its collector shorted to its base. This "diode" is connected across the emitter junction of the current source transistor 44 to maintain its collector current constant. A rectangular voltage pulse count signal is applied at an input terminal 46 to the base of transistor 42. The positive going count pulses render transistor 42 conducting and transistor 24 nonconducting while the negative going count pulses render transistor 42 nonconducting and transistor 24 conducting. Thus the output count pulses on the collectors of transistors 24 and 42 are 180° out of phase or inverted with respect to one another. As a result, the NPN transistors 12 and 14 of each counter stage are rendered conducting at different times by the count pulses. Only one of the 10 counter transistors 12 is rendered conducting at a time which is determined by whether a positive enabling signal is applied to its base through input conductor 20 from the previous counter stage. When the counter transistor 12 is rendered conducting, it transmits a negative going signal to the base of PNP transistor 16 rendering such PNP transistor conducting and causing a positive feedback signal to be transmitted from collector 34 to the base of transistor 12. This regenerative feedback latches the transistors 12 and 16 in an "on" state. At the same time, a positive going output signal is transmitted from collector 32 of transistor 16 to the base of transistor 14 which acts as an enabling voltage so that the next negative count pulse applied through input line 40 to its emitter renders transistor 14 also conducting.

The collector of the second NPN transistor 14 is connected through an interconnection 48 to the base of the second PNP transistor 18. Transistor 18 has its emitter connected to the D.C. supply voltage of +5 volts on conductor 28 and has three separate collectors 50, 52 and 54. The first collector 50 is connected to the common output 35 of the counter stage while the second collector 52 is connected to the enabling input of the next counter stage and third collector 54 is connected to the base of transistor 14 to provide positive feedback. Again it should be noted that only one of the counter stage transistors 14 having their emitters connected to count input conductor 40, is rendered conducting at a time as determined by the most positive base voltage applied to such transistors. In this manner the count progresses down the counter from one stage to another in a consecutive manner.

Since the present counter circuit is a ring counter, the enabling signal output of the tenth counter stage producing the nine count pulse is transmitted through a conductor 56 to the enabling input of the first counter stage producing the zero count pulse to enable the decade count to begin again, as shown in FIG. 1. At the same time a carry signal output is transmitted from the tenth counter stage through an additional transistor 58 of PNP type having its emitter connected to the base of the output PNP transistor and its base connected to the collector of the output NPN transistor of such stage across a coupling resistor 59 of about 1 kilohm. As a result, the output transistor 58 is rendered conducting to transmit a positive going carry out pulse from its collector through conductor 60 to the count input of the next counter stage, as shown in FIG. 1. Thus if the counter of FIG. 1 is the tens decade counter, the carry out conductor 60 goes to the count input of the hundreds decade counter so that these two counters are connected in a series.

A reset transistor 62 of NPN type is provided in the counter circuit of FIG. 1 with its emitter connected to the collector of current source transistor 44 and its collector connected through conductor 64 to the base of the input PNP transistor of the first counter stage. A positive going reset pulse applied to reset input terminal 66 at the base of transistor 62 renders such transistor conducting and causes a negative going reset pulse to be transmitted through conductor 64 to the base of the input PNP transistor of the first counter stage rendering it conducting. As a result, a positive enabling voltage is applied by its feedback collector to the base of the input NPN transistor of the first counter stage. Thus when the next count pulse is transmitted through conductor 22, it renders the input NPN transistor of the first stage conducting and resets the counter to zero.

A buffer storage circuit including ten identical switching circuit stages 68 is provided with the input of each storage stage connected to the output 35 of a different one of the counter stages 10. The storage circuit stores the count previously taken while a new count is taking place after reset of the counter. This enables subsequent readout of the stored count without stopping the counter. The buffer storage stage 68 includes an NPN transistor 70 and PNP transistor 72 with the base of transistor 70 connected as an input to the output 35 of the associated counter stage. The emitter of transistor 70 is connected to a source of transfer signal pulses through input conductor 74, while its collector is connected through an interconnection 76 to the base of transistor 72. Transistor 72 has its emitter connected to a positive D.C. supply voltage of +5 volts on line 78 and has its collector connected to the base of transistor 70 to provide positive feedback. The common terminal of the collector of transistor 72 and the base of transistor 70 is also connected through a pair of series voltage divider resistors 80 and 82 of about 1 kilohm each to a positive D.C. supply voltage of +1.2 volts at the common collector terminal of a pair of cascaded NPN transistors 83. The collector terminal of transistors 83 is also connected through a load resistor 85 of 5 kilohms to the conductor 78 for supplying a D.C. voltage of +5 volts thereto.

The output of the storage circuit 68 is taken from the junction of resistors 80 and 82 and transmitted along output conductor 84 to the input of one stage 86 of a digital to analog converter circuit. A transfer pulse is applied to conductor 74 by switching "off" an NPN control transistor 88 whose collector is connected thereto and whose base is connected through a resistor 89 of about 5 kilohms to a D.C. voltage source of +5 volts. The control transistor is quiescently biased in a conducting state, and is rendered nonconducting when a negative transfer signal is applied to an input terminal 90 at the base of such transistor. The emitter of the transfer transistor 88 is grounded and a current source diode formed by an NPN transistor 91 having its collector shorted to its base is connected across the emitter junction of such transfer transistor to provide it with a constant collector current in conductor 74 of about 2 milliamperes. This clears the storage circuit of the previously stored count and upon termination of the transfer signal, another or the same one of the NPN transistors 70 in the ten storage stages is rendered conducting by the count signal applied to its base. The positive going count signal is inverted by transistor 70 and applied as a negative going signal to the base of transistor 72 thereby also rendering the latter transistor conducting and causing a positive voltage feedback signal to be transmitted from its collector to the base of transistor 70. This causes a latching of the storage stage in an "on" condition. As in the counter, only one of the ten storage transistors 70 is rendered conducting at a time, such one being determined by the most positive base which in turn is governed by which of the count stages is producing an output count at output conductor 35. Since the transfer transistor 88 returns to a conducting state after termination of the transfer pulse, its output current in conductor 74 maintains the selected storage stage conducting after the count output moves to other storage stages so that the previous counter reading at the time of transfer is stored therein.

The digital to analog converter provides an analog readout for the stored counter signal and consists of ten identical converter stages 86 connected to the outputs of the storage stages 68. As shown in FIG. 1A, each converter stage 86 includes an NPN transistor 92 having its base connected to the output conductor 84 of the storage stage 68 and its emitter connected to a readout control conductor 94. The collector of the converter transistor 92 is connected through a load resistor 96 of about 500 ohms to the collectors of the adjacent converter transistors to form a chain of series connected load resistors. The readout control conductor 94 is connected to the collector of a readout control transistor 98 of NPN type which operates as a switched current source of about 1 milliampere. The base of transistor 98 is connected to a readout input terminal 100 and its emitter is grounded. A current source diode formed by an NPN transistor 101 having its collector shorted to its base is connected across the emitter junction of such transistor to provide it with a constant collector current in conductor 94 of 1 milliampere. When a positive readout pulse is applied to readout input 100, transistor 98 is rendered conducting and transmits D.C. current to the emitters of the NPN converter transistors 92. This causes one of the converter transistors to be switched "on," such one selected transistor being that having the most positive base as determined by the output voltages of the storage stages. The current flowing through the selected converter transistor 92 divides at its collector and flows in opposite directions down the chain of load resistors 96 in amounts dependent on the resistance in the two current paths to produce an analog output signal at one end of the chain. An NPN transistor 102 connected as a diode with its collector shorted to its base at a +5 volts potential, is connected to one end of the resistor chain and the other end of such chain is connected to an analog output terminal 104 through another NPN transistor 106. The base of transistor 106 is connected to a D.C. bias voltage of +5 volts on conductor 78 and to the base of count transistor 24 through resistor 107 of 4 kilohms, such count transistor having a base bias resistor 109 of 300 ohms. As a result, an analog signal is produced on the output terminal 104 whose amplitude varies in magnitude depending upon the number of the stored count.

As shown in FIG. 2, the ring counter and associated storage and converter circuits may be provided on a monolithic integrated circuit member 108 of silicon or other suitable semiconductor material. For clarity the metal connections have been removed from the integrated circuit member. The ring counter stage 10, the buffer storage stage 68 and the digital to analog converter stage 86 of FIGS. 1 and 1A are shown within dotted-line boxes 10', 68' and 86' in FIG. 2. While the integrated circuit member 108 includes four identical counter circuits of the type shown in FIG. 1 on a 0.060 inch member, only one is shown for purposes of simplicity. The counter stages 10' and the buffer storage stages 68' are all contained within a single P+ type isolation region 110 while the digital to analog converter stages 86' are all contained within another isolation region 112, such two isolation regions having a common isolation wall 114 separating the converter from the storage circuit.

Figure 3:
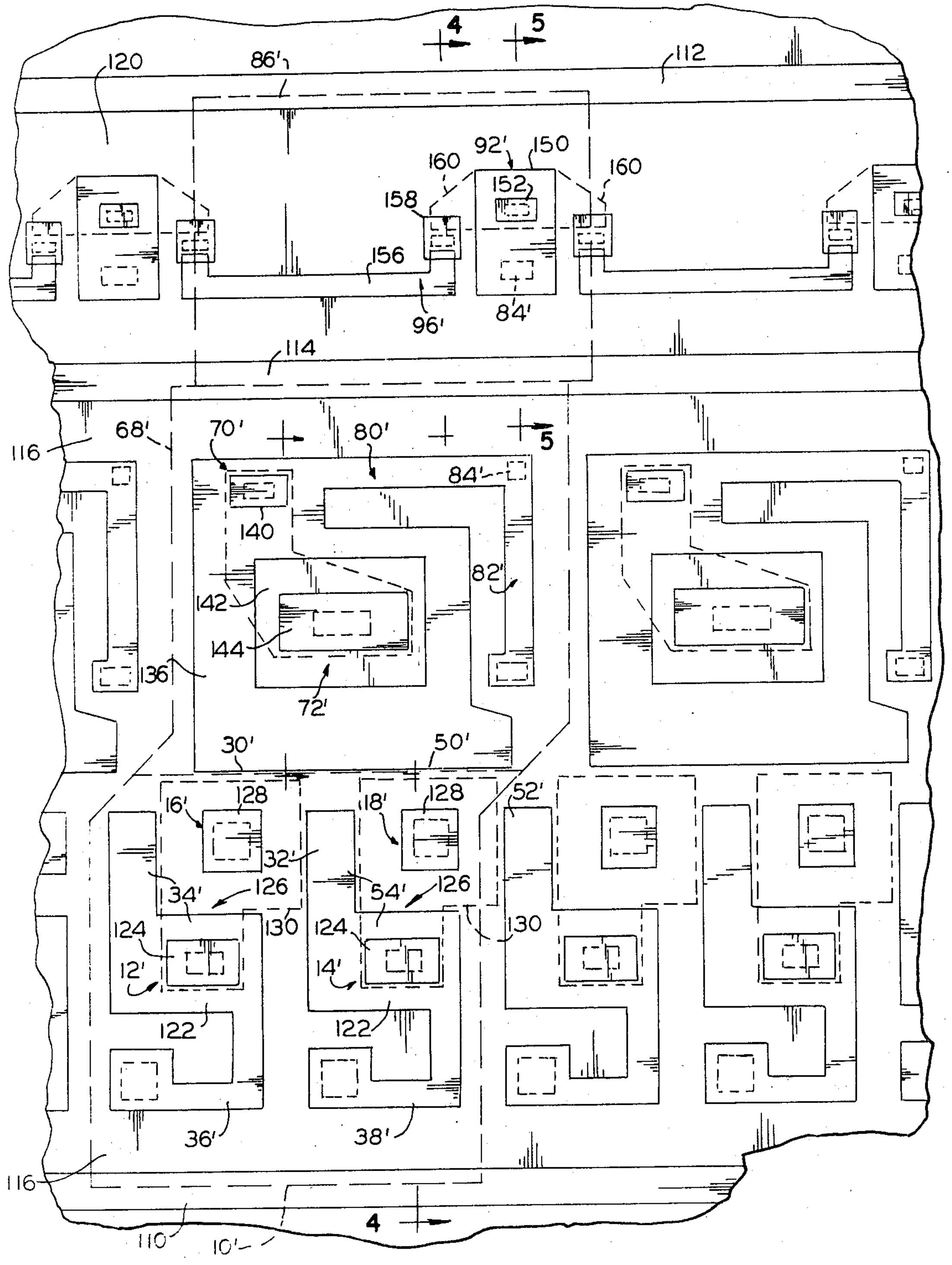
FIG. 3 is an elevation view on an enlarged scale of a portion of the integrated circuit semiconductor member of FIG. 2.

As shown in FIGS. 3 and 4, the counter stage 10' of the integrated circuit includes a common epitaxial region 116 divided by the isolation wall 110, 114 from the rest of an epitaxial layer of N-type silicon containing phosphorous doping impurity to provide a resistivity of 1 ohm-centimeter and having a thickness of 6 microns. This common epitaxial region 116 forms a common collector region for the NPN transistors 12 and 14 and a common base region for the PNP transistors 16 and 18 of the counter, as well as a common collector for the NPN transistors 70 and a common base for the PNP transistors 72 of the storage circuit. The epitaxial layer is formed in a conventional manner on a substrate 118 of P-type silicon containing boron doping impurity and having a resistivity of about 10 ohm-centimeters. Another common epitaxial region 120 of similar characteristics to region 116 is surrounded by an isolation wall 112, 114 and forms a common collector for the NPN transistors 96 of the converter circuit. The isolation regions 110, 112 and 114 are of P+ type material containing boron dopant and having a sheet resistance of 3 ohms per square with a thickness of 8 microns.

The bases of the NPN counter transistors 12 and 14 are formed by a portion of two P-type semi-conductor regions 122 of 2 microns thickness containing boron doping impurity and having a sheet resistance of 200 ohms per square, while the emitters of such transistors are formed by two N+ type semiconductor regions 124 diffused into such base regions. The emitter regions 124 are about 1.5 microns thick, contain phosphorous doping impurity and have a sheet resistance of 6 ohms per square. The P-type base region 122 is diffused into a collector portion 123 of the N-type epitaxial region 116. The PNP counter transistors 16 and 18 are lateral transistors formed by base portions 126 of the N-type epitaxial region 116 and emitter regions 128 of a P-type semiconductor similar to region 122. The three collectors 30', 32', 34' of PNP transistor 16' and 50', 52', 54' of the PNP transistor 18' are formed as separate collectors on two different P-type regions 122 and a third P-type region 136 within the storage stages 68', as indicated in FIG. 3. Also the bias resistors 36' and 38' are formed by different portions of the same P-type region 122. For purposes of clarity, the approximate physical position of the circuit components is indicated on FIG. 3 by primed reference numerals corresponding to those used in the circuits of FIGS. 1 and 1A.

The collector portion 123 of NPN transistors 12' and 14' is connected to the base portion 126 of the PNP transistors 16' and 18' through an interconnection portion of the common epitaxial region 116 of high resistance on the order of about 2,000 ohms per square. In order to reduce this interconnection resistance and to increase the beta current gain of the lateral PNP transistor, a plurality of separate buried layer regions 130 of N+ semiconductor material having a sheet resistance of 20 ohms per square and a thickness of 5 microns are provided beneath the interconnection portions of the epitaxial region. These buried layer regions are formed by selectively diffusing antimony doping impurity into the substrate member 118 before the epitaxial layer is formed thereon. The buried layer regions 130 are shown by dashed lines in FIG. 3 and include two buried layers for each counter stage so that there are at least twenty separate buried layer regions within the same common epitaxial region 116 associated with the counter alone. The low interconnection resistance of about 20 ohms associated with interconnections 24 and 48 due to the presence of the buried layer is shown in the circuit of FIG. 1A as resistances 132. This enables the epitaxial region 116 forming the common collectors of the NPN transistors and the common bases of the PNP transistors to be of a high resistance in order to effectively isolate such collectors and bases from each other as far as electrical signals are concerned. The high resistance interconnection of about 1,000 ohms due to the interconnection of the common bases of transistors 16 and 18 and the interconnection of the common collectors of transistors 12 and 14 solely through the epitaxial layer is shown as resistances 134 in FIG. 1A. It should be noted that the interconnection resistances 134 between counter stages have not been shown in FIG. 1A for purposes of clarity.

The use of the plurality of selective buried layer regions 130 enables the PNP and NPN transistors of the counter to be directly connected together through the epitaxial region without the use of metal interconnections thereby further reducing the area and increasing the reliability of the counter. In addition, it will be noted that the second collector 32 of the PNP transistor 16 is connnected to the base of the NPN transistor 14 through the P-type diffusion region 122 since such collector and base are provided by different portions thereof. Thus this interconnection of transistors 16 and 18 is also made without the use of the usual metalizing layer. The collectors 30 and 50 of the PNP counter transistors 16 and 18 are connected at output 35 to the base of the NPN storage transistor 70 through portions 30' and 50' of a common P-type semiconductor region 136 which again eliminates any metal interconnections between such transistors.

As shown in FIGS. 3 and 4, the buffer storage stage 68' includes a collector portion 138 of the epitaxial region 116 which together with the P-type base region 136 and an N+ type emitter portion 140 form the NPN transistor 70'. As stated previously, the lateral PNP transistor 72' includes a base portion 142 of the common epitaxial region 116, a collector portion of the P-type region 136 and P-type emitter region 144. The collector region 138 of transistor 70 and the base region 142 of transistor 72 are connected together through an interconnection portion of the epitaxial layer again to avoid metal layer connections. A buried layer region 146 of N+ type semiconductor material similar to that of buried layer 130 is provided beneath this interconnection portion of the epitaxial region to reduce the interconnection resistance. This interconnection resistance is shown as resistor 148 in FIG. 1A. Again it should be noted that the common bases of the PNP transistors 72 of adjacent converter stages are connected together through the high 2,000 ohms per square resistance of the epitaxial layer but these resistances have not been shown in FIG. 1A since they are so high as to effectively isolate the stages from each other. Similarly, the common collectors of the NPN transistors 70 of adjacent converter stages are connected together through the high resistance of the epitaxial layer but this isolation resistance has not been shown for the same reason.

The base of the NPN storage transistor 70 is connected to the collector of the PNP transistor 72 through the common P-type region 136 forming these electrodes and providing an interconnection of extremely low resistance thereby further eliminating metal connections. The voltage divider resistors 80 and 82 are formed by different portions 80′ and 82′ of the same P-type region 136 and the output of the storage stage is shown within a dashed-line box 84′ which represents the hole in the silicon oxide insulating layer through which the metal connection is made to the semiconductor region 136. As stated previously, for purposes of clarity, the metal connections to the sources of D.C. supply voltage and to other circuits outside of the epitaxial region 116 are not shown. Similar metal contact holes are indicated by the dashed-line boxes in semiconductor regions 140, 144 and the bottom of region 82′ as well as in regions 128, 124 and 122. However, it should be noted that no such metalized connections are employed as interconnections between transistors in the counter circuit or in the buffer storage circuit or between such two circuits. Instead all of these latter interconnections are made within the semiconductor member through the epitaxial region 116 or through diffused regions therein.

As shown in FIGS. 3 and 5, the digital to analog converter stage 86′ includes a P-type region 150 diffused into the epitaxial region 120 and forms the base of transistor 92′. An N+ type semiconductor region 152 is diffused into the base region 150 and forms the emitter of such transistor. The collector of transistor 92′ is provided by a portion of the epitaxial region 120 beneath the base region 150. A contact opening 84′ is provided through the silicon dioxide insulating layer 154 over the base portion 150 for the connection of such base to the output of the storage stage 68′ at the other contact opening 84′ over the junction of resistors 80′ and 82′. Thus there is a metal connection (not shown) on the surface of the silicon dioxide insulating layer 154 which extends between the two openings 84′ across the isolation region 114 forming the output conductor 84 of FIG. 1A. The load resistor 96′ is formed by another P-type semiconductor region 156 which is connected to the collector portion of the epitaxial region 120 by an N+ ohmic contact region 158 as shown in FIG. 4. Another buried layer region 160 is provided beneath the interconnection portion of the epitaxial region 120, extending between the collector portion under base region 150 and the ohmic contact region 158 to reduce the interconnection resistance. This low resistance buried layer interconnection is shown by resistance 162 in FIG. 1A. Here again it should be noted that the common collectors of the ten converter transistors 92 are connected together through the high resistance of the epitaxial region 120 which isolates the collectors from each other.

The remainder of the integrated circuit of FIG. 2 including transistors 24′, 42′, 44′, 62′ and 106′ as well as transistors 83′, 88′, 98′ and 102′ are formed in a conventional manner within separate epitaxial regions.

It will be obvious to those having ordinary skill in the art that many changes may be made in the above described details of the preferred embodiment of the present invention without departing from the spirit of the invention. For example, the NPN and PNP transistor types can be reversed, and the semiconductor material, doping impurities, values of sheet resistance, etc. of the integrated circuit can be changed. Also it is possible to employ junction gated field effect transistors together with bipolar transistors in the same integrated circuit. Therefore the scope of the invention should only be determined by the following claims.

I claim:

1. A counter circuit comprising:

a plurality of interconnected bistable counter stages each including a pair of first bipolar transistors and a pair of second bipolar transistors, with one first transistor having its collector connected to the base of one second transistor through a collector to base connection and having its base connected as an enabling input to an output of the previous stage, and with the other first transistor having its collector connected to the base of the other second transistor through a collector to base connection;

said second transistors each having three separate collectors with one collector connected to the base of one first transistor to provide positive feedback, another collector connected to the base of another first transistor to couple the second transistors together within a stage and to couple adjacent stages together, and the third collector connected to a common output of the stage;

a pair of count signal sources connected to the emitters of different ones of the first transistors of each stage for applying thereto count signals which are phase inverted relative to each other; and a plurality of bias resistors connected between the bases of the first transistors and ground.

2. A counter circuit in accordance with claim 1 in which the first and second transistors are part of an integrated circuit formed in an epitaxial layer of one type of conductivity on a substrate member of semiconductor material with the entire counter circuit being provided in one epitaxial region surrounded by a single isolation region of opposite type of conductivity diffused through the epitaxial layer.

3. A counter circuit in accordance with claim 2 in which a common portion of said one epitaxial region provides the collectors for all of said first transistors and the bases for all of said second transistors as well as said collector to base connections, and a plurality of buried layer regions of lower resistivity than the epitaxial layer are provided on the substrate beneath the collector to base connections to lower the resistance of such connections.

4. A counter circuit in accordance with claim 3 in which the first transistors are NPN transistors and the second transistors are PNP transistors.

5. A counter circuit in accordance with claim 3 in which said one epitaxial region also contains a buffer storage circuit including a plurality of bistable storage stages, each storage stage being connected to the output of a different counter stage.

6. A counter circuit in accordance with claim 5 in which the bistable storage stages each include a pair of transistors, one transistor having its base connected in common to the collector of the other transistor and to the output of the counter stage as well as to one end of a pair of series connected voltage divider resistors whose other end is grounded and whose intermediate terminal is connected to the output of the storage stage, said one transistor having its collector connected to the base of the other transistor through a second collector to base connection provided by a portion of the epitaxial region, a second buried layer region of less resistivity than the epitaxial region provided on the substrate beneath each of the second collector to base connections, and a transfer signal source connected to the emitter of said one transistor.

7. An integrated circuit comprising a counter circuit in accordance with claim 6 and a digital to analog converter circuit provided within a second epitaxial region electrically isolated from said one epitaxial region, said converter circuit including a plurality of converter stages having their inputs connected to the outputs of the storage stages.

8. An integrated circuit in accordance with claim 7 in which the converter stages each include a converter transistor having its base connected to the output of a storage stage, its emitter connected to a readout signal source, and its collector connected to the collector of another converter stage through a coupling resistor, said second epitaxial region providing a common collector for all of the converter transistors and connection portions between the collectors and the coupling resistors, and a plurality of third buried layer regions of lower resistivity than the epitaxial layer, provided on the substrate beneath said connection portions.

* * * * *